United States Patent [19]

Kusakabe

[11] Patent Number: 5,111,068
[45] Date of Patent: May 5, 1992

[54] DIFFUSION RESISTOR CIRCUIT

[75] Inventor: Hiromi Kusakabe, Yokohama, Japan

[73] Assignee: Kabushiki Kaisha Toshiba, Kanagawa, Japan

[21] Appl. No.: 175,294

[22] Filed: Mar. 30, 1988

[30] Foreign Application Priority Data

Mar. 31, 1987 [JP] Japan ................................ 62-78580

[51] Int. Cl.⁵ .................... H01L 25/00; H01L 27/02; H01C 1/012
[52] U.S. Cl. ............................... 307/303.1; 357/51; 338/307
[58] Field of Search ................. 307/303, 304, 303.1; 357/51; 338/307

[56] References Cited

U.S. PATENT DOCUMENTS

| | | | |
|---|---|---|---|
| 3,990,092 | 11/1976 | Yoshimura | 357/51 |
| 4,034,395 | 7/1977 | Abdelrahman et al. | 357/51 |
| 4,044,371 | 8/1977 | Abdelrahman et al. | 357/51 |
| 4,141,023 | 2/1979 | Yamada | 307/304 |
| 4,164,668 | 8/1979 | Delaporte et al. | 357/51 |
| 4,263,518 | 4/1981 | Ballatore et al. | 357/51 |

FOREIGN PATENT DOCUMENTS

| | | | |
|---|---|---|---|
| 2351505 | 12/1977 | France. | |
| 0003963 | 1/1984 | Japan | 357/51 |
| 0035555 | 2/1985 | Japan | 357/51 |
| 1517266 | 7/1978 | United Kingdom. | |
| 2044998 | 10/1980 | United Kingdom. | |

OTHER PUBLICATIONS

Leidich, "IC Resistor Leakage Current Compensation", No. 1213, Sep. 1, 1978.
Nikkei Electronics, Nov. 9, 1981, pp. 122-136.

Primary Examiner—Stanley D. Miller
Assistant Examiner—Trong Quang Phan
Attorney, Agent, or Firm—Finnegan, Henderson, Farabow, Garrett and Dunner

[57] ABSTRACT

A diffusion resistor circuit for reducing distortion caused in a diffusion resistor. The circuit includes the diffusion resistor having a substrate, an island area including an impurity of a first polarity diffused into the substrate and a resistor area including an impurity of a second polarity diffused into the island area, a circuit for supplying a current signal through the resistor area and another circuit connecting the island area to a generally central point of the resistor area for reducing distortion of the current signal.

3 Claims, 3 Drawing Sheets

DIFFUSION RESISTOR CIRCUIT

FIELD OF THE INVENTION

The present invention relates generally to a diffusion resistor circuit, and more particularly to a circuit arrangement of diffusion resistors suitable for a bipolar integrated circuit apparatus.

BACKGROUND OF THE INVENTION

Bipolar integrated circuits, for example, bipolar analog integrated circuits comprise a large number of resistors. The resistors of the bipolar integrated circuits typically are made by diffusion processes.

A typical diffusion resistor is shown in FIG. 1. In FIG. 1, the diffusion resistors 10 are comprised of the island areas 10a diffused on a substrate 10b and resistor areas 10c diffused on the island areas 10a. The diffusion resistors 10 are separated from other diffusion resistors 10 or other circuit elements by isolation areas 10d diffused between the island areas 10a. The island area 10a and the resistor area 10c correspond to the collector area and the base area of typical transistors constructed on the integrated circuit by diffusion processes. The diffusion resistors 10 are connected in series by coupling the resistor areas to the adjacent resistor areas.

Bipolar analog integrated circuits for audio apparatus are required to have less distortion. However, diffusion resistors are insufficient in respect to distortion, compared to other types of resistors. Therefore, some proposals have been made for reducing distortion of circuits having diffusion resistors.

For example, Japanese magazine "Nikkei Electronics", Issue of Nov. 9, 1981, pp. 122-136, reports an article regarding a diffusion resistor circuit. FIG. 3 on page 128 of the article entitled "Integrated Circuits dedicated for Noise Suppression Circuit of Audio Apparatus" discloses a diffusion resistor circuit with an improved distortion.

An equivalent circuit to that of the above article is shown in FIG. 2 of this application for the sake of convenience. As shown in FIG. 2, three diffusion resistors 10 are connected in series. In each diffusion resistor 10, one end terminal 10e of each resistor area 10c is coupled to an island area 10a thereof. As a result, the potential of the one end terminal 10e of the resistor area 10c is equalized to the potential of the island area 10a in each diffusion resistor 10. The diffusion resistors 10 are coupled in series to obtain a desired value of resistance. In the series circuit, the island areas 10a coupled to the one end terminals 10e of the resistor areas 10c are coupled to the other end terminals 10f of adjacent diffusion resistors 10. Therefore, the potentials of the island areas 10a are applied to the same end terminals 10e of the resistor areas 10c.

The article says that the diffusion resistor circuit reduces distortion lower than the distortion in prior circuits by one order. However, the reduction of the distortion is still insufficient for higher grade audio apparatus. This is because the distortion generated by the resistor areas 10c is accumulated in the series circuit.

A report entitled "Application of Poly-silicon Resistors to Analogue Integrated Circuit" in "Electronics and Communication Engineers Institute (Japan), Technical Study Report", SSD 79-48, issued in 1978, reports another example for reducing distortion in integrated circuits having diffusion resistors. FIG. 14 in this Report, on page 55, shows a graph of total distortion to output voltage response characteristics. In FIG. 14, the total distortion in the case of the poly-silicon resistor is reduced greatly in comparison to distortion in the case of other diffusion resistors. However, the report is limited to an application for an inverse phase feedback amplifier, as shown in FIG. 13, on page 59 of the report. That is, the poly-silicon resistor has a typical resistance value like other diffusion resistors. Further, the poly-silicon resistor has some drawbacks in that it requires many steps to manufacture and is high in cost compared to other diffusion resistors.

SUMMARY OF THE INVENTION

It is, therefore, an object of the invention to provide a diffusion resistor circuit which has a reduced distortion.

Another object of the invention is to provide a diffusion resistor circuit which can be made without the need for special processes in manufacturing.

A further object of the invention is to provide a diffusion resistor circuit which can be manufactured at a low cost.

In order to achieve the above objects, a diffusion resistor circuit according to one aspect of the present invention in which the diffusion resistor circuit includes the diffusion resistor having a substrate, an island area including an impurity of a first polarity diffused into the substrate and a resistor area including an impurity of a second polarity diffused into the island area, a circuit for supplying a current signal through the resistor area and another circuit connecting the island area to a generally central point of the resistor area for reducing distortion of the current signal.

Additional objects and advantages of the invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
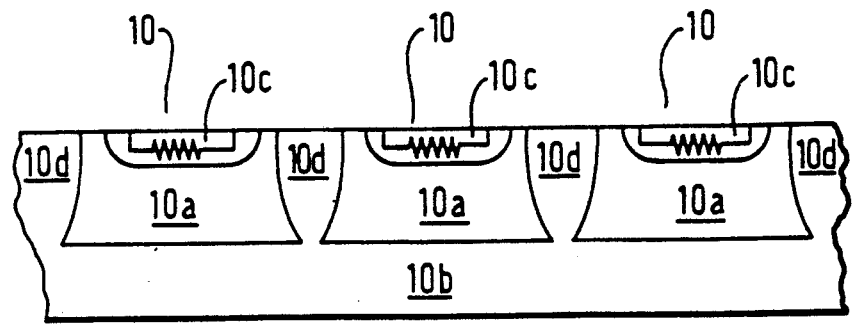
FIG. 1 is a section showing a typical diffusion resistor.

The present invention will be described in detail with reference to the FIGS. 5 through 9. Throughout drawings, reference numerals or letters used in FIGS. 1, 2, 3 and 4 (Prior Art) will be used to designate like or equivalent elements for simplicity of explanation.

Figure 5:
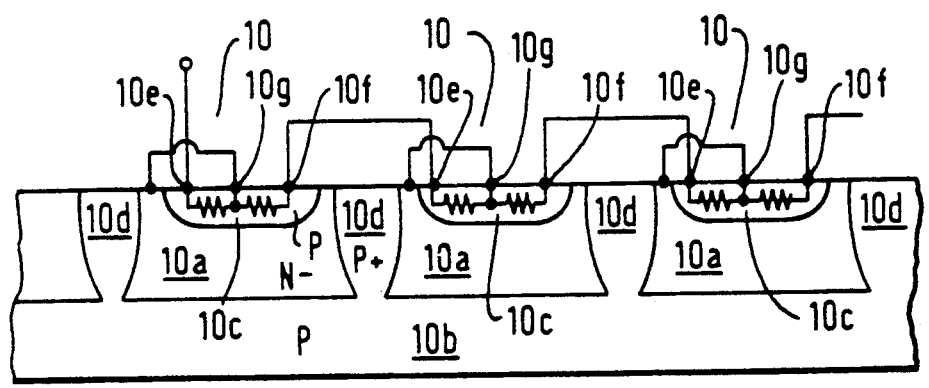
FIG. 5 is an explanatory section showing a first embodiment according to the present invention.

Referring now to FIG. 5 a first embodiment of the diffusion resistor circuit according to the invention will be described in detail.

In FIG. 5, a substrate (P-type semiconductor) $10b$, island areas $10a$ (N⁻channel) diffused into the substrate $10b$, isolation areas (P⁺channel) $10d$ isolating the island areas $10a$ from other island areas $10a$ or other circuit elements on the substrate $10b$, and resistor areas (P channel) $10c$ diffused into the island areas $10a$ are indicated. The diffusion resistors 10 are formed by diffusion in the substrate $10b$.

In each resistor area $10c$ of the diffusion resistor 10, one terminal $10e$ and another terminal $10f$ are respectively located at one end and another end of the resistor area $10c$. The one terminal $10e$ of the one resistor area $10c$ is coupled to the other terminal $10f$ of the resistor area $10c$ of the adjacent diffusion resistor 10. Center terminals $10g$ are also located at the center of the resistor area $10c$. The center terminals $10g$ are coupled to the island areas $10a$. Thus, the diffusion resistors 10 are connected in series so that a desired resistance value is established.

Distortion generated by diffusion resistors can be explained as the spreading of depletion layers due to the bias voltage between resistor areas $10c$ and the island areas $10a$. It is known that a change in resistance is in proportion to the square root of the approximate value of the bias voltage. A change in resistance can be theoretically analyzed as described below.

A change in diffusion resistance is given by:

$$\frac{\Delta R}{R} = \alpha \cdot \sqrt{\phi + V_s} \quad (1)$$

wherein $\phi$ is junction potential, $V_s$ is inverse bias voltage (applied externally), and $\alpha$ is a coefficient.

For the sake of convenience of operation, apply Taylor series for the equation (1) so that the following equation is obtained:

$$\frac{\Delta R}{R} = \alpha \cdot \sqrt{\phi} \cdot \left[ 1 + \frac{1}{2} \cdot \frac{V_s}{\phi} - \frac{3}{8} \cdot \left(\frac{V_s}{\phi}\right)^2 + \frac{5}{16} \cdot \left(\frac{V_s}{\phi}\right)^3 - \cdots \right] \quad (2)$$

Supposing $V_s/\phi \ll 1$, then, it will be sufficient to consider only the second order term, i.e., $(V_s/\phi)^2$. Then, the following equation is obtained;

$$\frac{\Delta R}{R} = \alpha \cdot \sqrt{\phi} \cdot \left[ 1 + \frac{1}{2} \cdot \frac{V_s}{\phi} - \frac{3}{8} \cdot \left(\frac{V_s}{\phi}\right)^2 \right] \quad (3)$$

Analysis I: A change in resistance will be analyzed herein using the equation (3).

Figure 3:
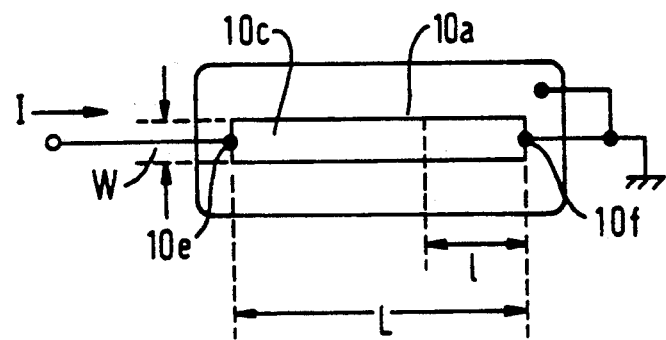
FIG. 3 is an explanatory front view of one unit of the diffusion resistor of FIG. 2.
Figure 4:
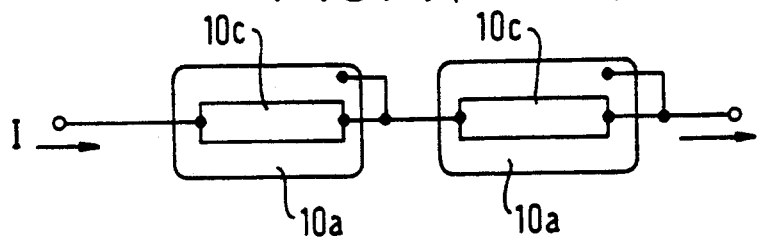
FIG. 4 is an explanatory front view of two units of diffusion resistor of FIG. 2 with a series connection between the two units.

The one unit of the typical diffusion resistor 10 is shown in FIG. 3 for explanatory use. According to the drawing, the inverse bias voltage $V_s$ at a measuring point is given as follows:

$$V_s = \frac{l}{W} \cdot \rho F \cdot I \quad (4)$$

wherein W is the width of the resistor area $10c$, l is the distance of the measuring point from the reference position, i.e., the other end $10f$ of the resistor area $10c$, $\rho F$ is the sheet resistance at zero bias.

Then, the sheet resistance $\rho(l)$ at the measuring point is given as follows:

$$\rho(l) = \rho F \cdot \left[ 1 + \alpha \cdot \sqrt{\phi} \cdot \left\{ 1 + \frac{1}{2 \cdot \phi} \cdot \frac{l}{W} \cdot \rho F \cdot I - \frac{3}{8 \cdot \phi^2} \cdot \left(\frac{l}{W} \cdot \rho F \cdot I\right)^2 \right\} \right] \quad (5)$$

The total resistance $R(I)$ given by the modulation of the depletion layer is defined as follows:

$$R(I) = \int_0^L \rho(l) \cdot \frac{dl}{W} \quad (6)$$

$$= \frac{\rho F}{W} \cdot \int_0^L (1 + \alpha \cdot \sqrt{\phi}) \cdot dl + \frac{\alpha \cdot \rho F^2 \cdot I}{2 \cdot \sqrt{\phi} \cdot W^2} \cdot \int_0^L l \cdot dl - \frac{3 \cdot \alpha \cdot \rho F^3 \cdot I^2}{8 \cdot W^3 \cdot \phi^{3/2}} \cdot \int_0^L l^2 \cdot dl$$

$$= \frac{\rho F}{W} \cdot [l \cdot (1 + \alpha \cdot \sqrt{\phi})]_0^L + \frac{\alpha \cdot \rho F^2 \cdot I}{2 \cdot \sqrt{\phi} \cdot W^2} \cdot \left[\frac{l^2}{2}\right]_0^L - \frac{3 \cdot \alpha \cdot \rho F^3 \cdot I^2}{8 \cdot W^3 \cdot \phi^{3/2}} \cdot \left[\frac{l^3}{3}\right]_0^L$$

Now, let $(L/W) \cdot \rho F = R_F$ ($R_F$: a total resistance at zero bias). The equation (6) is changed as follows:

$$R(I) = (1 + \alpha \cdot \sqrt{\phi}) + \frac{\alpha \cdot R_F^2}{4 \cdot \sqrt{\phi}} \cdot I - \frac{\alpha \cdot R_F^3}{8 \cdot \phi^{3/2}} \cdot I^2 \quad (7)$$

In order to apply a sine component to the current I, let $I = I_1 \cdot \sin \omega t$, and the voltage $v(R)$ across the diffusion resistor 10 is given as follows:

$$v(R) = I \cdot R(I) \quad (8)$$

$$= I_1 \cdot \sin \omega t \cdot \left[ R_F \cdot (1 + \alpha \cdot \sqrt{\phi}) + \frac{\alpha \cdot R_F^2}{4 \cdot \sqrt{\phi}} \cdot I_1 \cdot \sin \omega t - \frac{\alpha \cdot R_F^3}{8 \cdot \phi^{3/2}} \cdot I_1^2 \cdot \sin^2 \omega t \right]$$

Now, let $I_1 \cdot R_F = \sqrt{2} \cdot Vrms$ (Vrms: the effective voltage across the diffusion resistor 10), and $\alpha \cdot \sqrt{2} \ll 1$. Then, the voltage v(R) is given as follows:

$$v(R) = \frac{\alpha \cdot Vrms^2}{4 \cdot \sqrt{\phi}} + \left(\sqrt{2} - \frac{3 \cdot \sqrt{2} \cdot \alpha}{16 \cdot \phi^{3/2}} \cdot Vrms^2 \right) \cdot Vrms \cdot \quad (9)$$

$$\sin\omega t - \frac{\alpha \cdot Vrms^2}{4 \cdot \sqrt{\phi}} \cdot \cos 2\omega t + \frac{\sqrt{2} \cdot \alpha \cdot Vrms^3}{16 \cdot \phi} \cdot \sin 3\omega t$$

In the equation (9), a following is applied:

$$\sqrt{2} \gg \frac{3 \cdot \sqrt{2} \cdot \alpha}{16 \cdot \phi}$$

Accordingly, the equation (8) further is changed as follows:

$$v(R) = \frac{\alpha \cdot Vrms^2}{4 \cdot \sqrt{\phi}} + \sqrt{2} \cdot Vrms \cdot \sin\omega t - \frac{\alpha \cdot Vrms^2}{4 \cdot \sqrt{\phi}} \cdot \cos 2\omega t + \quad (10)$$

$$\frac{\sqrt{2} \cdot \alpha \cdot Vrms^3}{16 \cdot \phi^{3/2}} \cdot \sin 3\omega t$$

Considering now the secondary distortion $THD_2$, and the tertiary distortion $THD_3$, the following results are obtained:

$$THD_2 = \frac{\alpha \cdot Vrms^2}{4 \cdot \sqrt{\phi}} \cdot \frac{1}{\sqrt{2} \cdot Vrms} = \frac{\alpha \cdot Vrms}{4 \cdot \sqrt{2 \cdot \phi}} \quad (11)$$

$$THD_3 = \frac{\sqrt{2} \cdot \alpha \cdot Vrms^3}{\sqrt{2} \cdot Vrms \cdot 16 \cdot \phi^{3/2}} = \frac{\alpha \cdot Vrms^2}{16 \cdot \phi^{3/2}} \quad (12)$$

Analysis II: Now, the distortion of the diffusion resistor 10 according to the invention will be analyzed hereafter.

Figure 6:
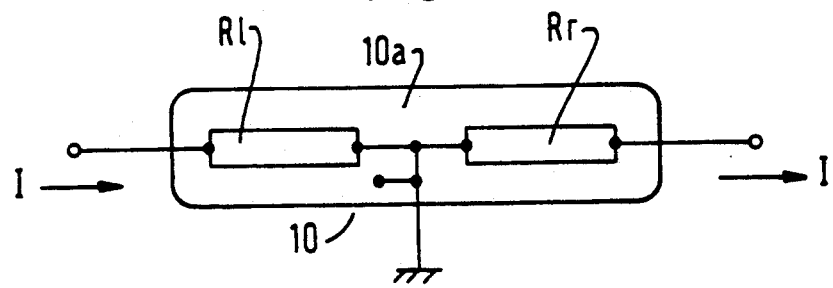
FIG. 6 is an explanatory front view of one unit of diffusion resistor of FIG. 5.

The diffusion resistor circuit according to the present invention can be analyzed by using FIG. 6. In FIG. 6, a part R1 of the diffusion resistor 10 on the left side itself has the same configuration as the diffusion resistor 10 in FIG. 3. Therefore, the equation (4) is also applicable for the analysis of the diffusion resistor 10 of FIG. 6.

Letting now each coefficient of equation (4) be replaced with A, B, and C. Then the equation (4) will be changed as follows:

$$R1 = R(I) = A - B \cdot I - C \cdot I^2 \quad (13)$$

Regarding another part of the diffusion resistor Rr, as shown in FIG. 6, of the diffusion resistor 10 on the right side, the resistance Rr(I) of the part can be analyzed as follows. That is, the diffusion resistor 10 in FIG. 3 is supplied with an inverse current $-I$. Then, the analytical results mentioned above can be applicable.

$$Rr = R(-I) = A + B \cdot I - C \cdot I^2 \quad (14)$$

Therefore, the total resistance R is given as follows:

$$R = R1 + Rr = R(I) + R(-I) = 2 \cdot A - 2 \cdot C \cdot I^2 \quad (15)$$

Now, let $I = I_1 \cdot \sin \omega \cdot t$, and consider the voltage v'(R) between the left side and the right side resistors R1 and Rr connected in series. Then, the voltage v'(R) is given as follows:

$$v'(R) = I \cdot [R1 + Rr] \quad (16)$$

$$= 2 \cdot A \cdot I_1 \cdot \sin\omega t - \frac{2 \cdot C \cdot I_1^3}{4} \cdot (3 \cdot \sin\omega t - \sin 3\omega t)$$

$$= \left(2 \cdot A - \frac{3}{2} \cdot C \cdot I_1^2\right) \cdot I_1 \cdot \sin\omega t - \frac{C \cdot I_1^3}{2} \cdot \sin 3\omega t$$

Now substitute $A = R_F(1 + 2\sqrt{\phi})$ and $C = \alpha \cdot R_F^3 / 8 \cdot \phi^{3/2}$ into the equation (16), and make an omission like the equation (6), then the equation (16) is changed as follows:

$$v'(R) = 2 \cdot R_F \cdot I_1 \cdot \sin\omega t + \frac{\alpha \cdot R_F^3 \cdot I_1^3}{16 \cdot \phi^{3/2}} \cdot \sin 3\omega t \quad (17)$$

Substituting $R_F \cdot I_1 = (\sqrt{2}/2) \cdot Vrms$, then:

$$v'(R) = \sqrt{2} \cdot Vrms \cdot \sin\omega t + \frac{\sqrt{2} \cdot \alpha \cdot Vrms^3}{64 \cdot \phi^{3/2}} \cdot \sin 3\omega t \quad (18)$$

is obtained.

Consider the secondary distortion $THD_2'$ and the tertiary distortion $THD_3'$. As shown in equation (6), the secondary term does not exist. Therefore, the following results are obtained:

$$THD_2' = 0 \quad (19)$$

$$THD_3' = \frac{1}{\sqrt{2} \cdot Vrms} \cdot \frac{\sqrt{2} \cdot \alpha \cdot Vrms^3}{64 \cdot \phi^{3/2}} = \frac{\alpha \cdot Vrms^2}{64 \cdot \phi^{3/2}} \quad (20)$$

Figure 2:
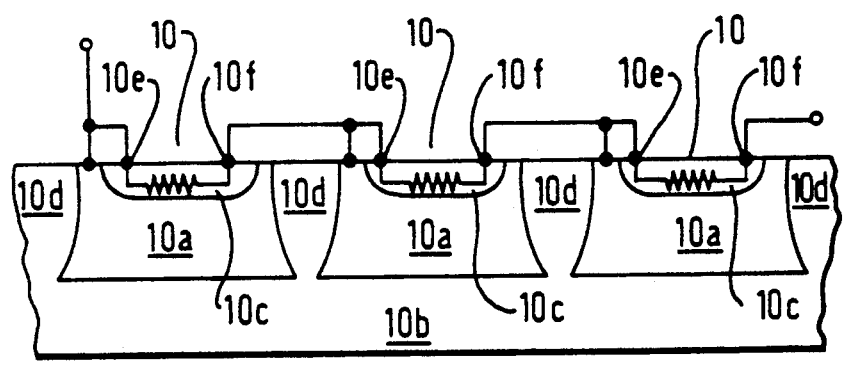
FIG. 2 is a section showing a conventional diffusion resistor circuit, i.e., a diffusion resistor circuit as described in "Nikkei Electronics", Issue of Nov. 9, 1981.

Analysis III: Next, the distortion of the conventional diffusion resistor circuit, as shown in FIG. 2, will be analyzed. The analysis in this case can be made by using FIG. 4. In this analysis, the effective voltage Vrms, which is the result from the first analysis I, is replaced by $(\frac{1}{2}) \cdot Vrms$. Consider the secondary distortion $THD_2''$ and the tertiary distortion $THD_3''$. The following results are obtained:

$$THD_2'' = \frac{\alpha}{8 \cdot \sqrt{2 \cdot \phi}} \cdot Vrms \quad (21)$$

$$THD_3'' = \frac{\alpha}{64 \cdot \phi^{3/2}} \cdot Vrms \quad (22)$$

The tertiary distortion $THD_3''$ is the same as the tertiary distortion $THD_3$ in the embodiment of FIG. 6.

Analysis IV: Next, actual numerical values are given to the analyses of FIG. 3 (typical diffusion resistor) and FIG. 4 ("NIKKEI ELECTRONICS"), and FIG. 5 (present invention). Each parameter is determined to obtain the secondary distortions $THD_2$, $THD_2'$ and $THD_2''$, and the tertiary distortions $THD_3$, $THD_3'$ and $THD_3''$.

The results are shown in the following Table.

| Dis- | $V_{rms}$ | | | | | Unit |
|---|---|---|---|---|---|---|
| tortion | 0.1 V | 0.2 V | 0.3 V | 0.4 V | 0.5 V | V |
| $THD_2$ | −94.0 | −88.0 | −84.5 | −82.0 | −80.0 | dB |
| $THD_2''$ | −100.0 | −94.0 | −90.5 | −88.0 | −86.1 | dB |
| $THD_2'$ | −∞ | −∞ | −∞ | −∞ | −∞ | dB |
| $THD_3$ | −121.0 | −109.0 | −101.9 | −96.0 | −93.1 | dB |
| $THD_3''$ | −133.1 | −121.0 | −114.0 | −109.0 | −105.1 | dB |
| $THD_3'$ | −133.1 | −121.0 | −114.0 | −109.0 | −105.1 | dB |

$\alpha = 1 \times 10^{-3} (1/\sqrt{V})$
$\phi = 0.79 (V)$

In case of two diffusion resistors 10 coupled in series, as shown in FIG. 1, the secondary distortion $THD_2''$ and the tertiary distortion $THD_3''$ are given as follows:

$$THD_2 = \frac{\alpha}{8 \cdot \sqrt{2 \cdot \phi}} \cdot Vrms \quad (23)$$

$$THD_3 = \frac{\alpha}{64 \cdot \phi^{3/2}} \cdot Vrms^2 \quad (24)$$

In the case of the diffusion resistor 10 being biased at its central point by connection to the potential of the island area 10a, the secondary distortion $THD_2'$ and the tertiary distortion $THD_3'$ are given as follows:

$$THD_2' = 0 \quad (25)$$

$$THD_3' = \frac{\alpha}{64 \cdot \phi^{3/2}} \cdot Vrms^2 \quad (26)$$

Thus, the secondary distortion $THD_2'$ is theoretically removed, leaving only the tertiary distortion $THD_3'$. Comparing the secondary distortion $THD_2''$ in the conventional case to the tertiary distortion $THD_3'$ according to the present invention, as shown in the Table, the total distortion THD' becomes smaller by 27.0 dB (=121.1 dB−94.0 dB), when the effective voltage Vrms equals to 0.2 V.

Figure 7:
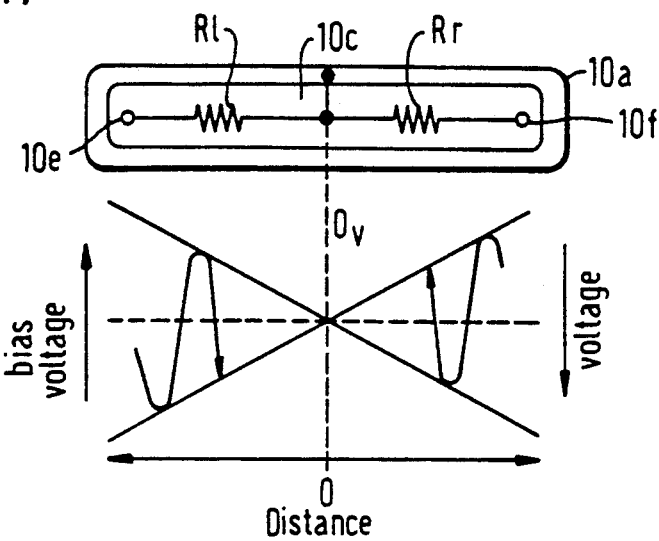
FIG. 7 is a graph showing an operation of the circuit of FIG. 5.

As stated above, the total distortion of the invention becomes smaller. This is because the central point of the resistor area 10c is connected to the island area 10a. Then, the distortions generated by the left and right part resistors Rl and Rr of the resistor area 10c will be in opposite phase to each other. Thus, they give a push-pull action to cancel the distortions mutually, as shown in FIG. 7.

Figure 8:
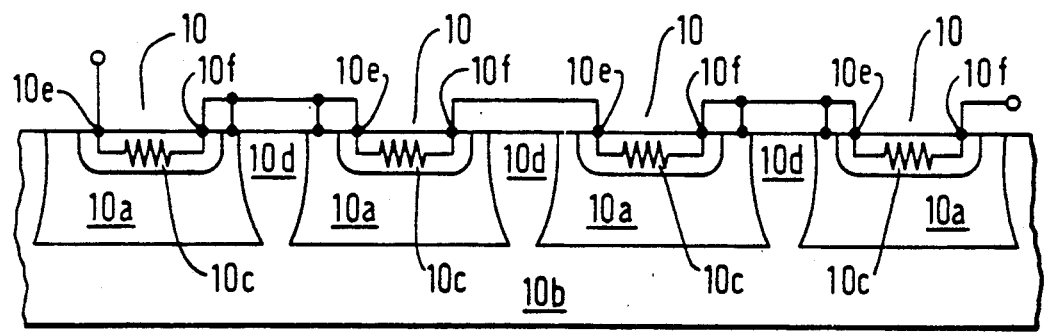
FIG. 8 is an explanatory section showing a second embodiment of the diffusion resistor circuit according to the present invention.

FIG. 8 shows a second embodiment according to the invention. This second embodiment reveals that it is possible to obtain the same effect as the above-mentioned first embodiment by alternately selecting the terminal on the input side and the terminal on the output side of each diffusion resistor 10 connected in series and by connecting each terminal selected to the adjacent diffusion resistor 10. That is to say, according to the second embodiment, if the two diffusion resistors 10 are considered to be one pair, this pair will work as one diffusion resistor 10 in the same way as one diffusion resistor 10 in FIG. 5.

Figure 9:
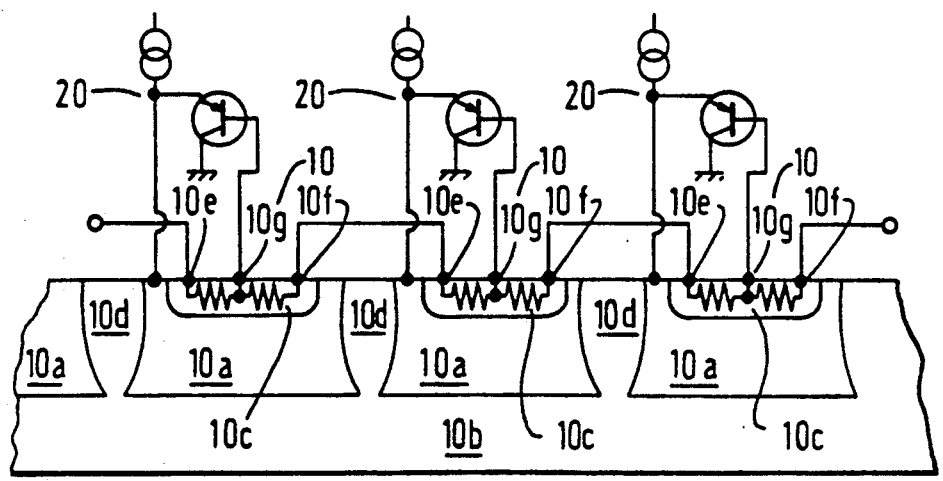
FIG. 9 is an explanatory section showing a modification of the diffusion resistor circuit according to the present invention shown in FIG. 5.

FIG. 9 shows a modification of the first embodiment according to the invention. According to this modification, a circuit connection is carried out by using level shift circuits 20 so that the potential of each island area 10a can be shifted from the potential of the central point 10g of the resistor area 10c by a specified voltage. By applying such a circuit connection, the push-pull action of distortion can be obtained with an inverse voltage kept high between the resistor area 10c and the island area 10a, decreasing the generation of distortion.

As described hereinbefore, in contrast to prior art wherein diffusion resistors 10 are simply connected in series, the present invention enables distortion owing to the depletion layer to be lower than the distortion of the prior art circuit by one order of magnitude. The invention uses diffusion resistors which generate lower noise than poly-silicon resistors. Being produced easily, the diffusion resistor enables the present invention to be embodied at small cost.

While there has been illustrated and described what are at present considered to be preferred embodiments of the invention, it will be understood by those skilled in the art that various changes and modifications may be made, and equivalents may be substituted for elements thereof without departing from the true scope of the invention. In addition, many modifications may be made to adapt a particular situation or material to the teaching of the invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A diffusion resistor circuit comprising:
    a plurality of diffusion resistors, each of said plurality of diffusion resistors including a substrate, an island area including an impurity of a first polarity diffused into the substrate, a resistor area including an impurity of a second polarity diffused into the island area and an input terminal and an output terminal;
    means connecting the resistor areas of the plurality of diffusion resistors in series for supplying a current signal through the resistor areas so that the diffusion resistors are successively connected in adjacent pairs; and
    circuit means alternately connecting the island areas of each successive adjacent pair of diffusion resistors to the input terminal of one resistor area of the adjacent pair of diffusion resistors and the output terminal of the other resistor area of the adjacent pair of diffusion resistors for reducing distortion of the current signal.

2. A diffusion resistor circuit, comprising:
    a diffusion resistor including a substrate, an island area including an impurity of a first polarity diffused into the substrate, a resistor area including an impurity of a second polarity diffused into the island area;
    means for supplying a current signal through the resistor area; and
    circuit means connecting the island area to a generally central point of the resistor area for reducing distortion of the current signal, said circuit means including level shift means for applying a bias voltage between the island area and the generally central point for increasing the voltage between the island area and the resistor area.

3. A diffusion resistor circuit, comprising:
    a plurality of diffusion resistors each including a substrate, an island area including an impurity of a first polarity diffused into the substrate, a resistor area including an impurity of a second polarity diffused into the island area and an input and an output terminal connected to the resistor area;

circuit means connecting the resistor areas of the plurality of diffusion resistors in series for supplying a current signal through the resistor areas; and level shift means, coupled in each said diffusion resistor between the island area and a generally central point of the resistor area, for increasing the voltage between the island area and the resistor area.

* * * * *